United States Patent
Rushing et al.

(10) Patent No.: US 7,376,922 B2
(45) Date of Patent: May 20, 2008

(54) METHOD AND APPARATUS FOR INTEGRATED CIRCUIT DATAPATH LAYOUT USING A VECTOR EDITOR

(75) Inventors: John A. Rushing, Madison, AL (US); Veerapaneni Nagbhushan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 463 days.

(21) Appl. No.: 10/676,893

(22) Filed: Sep. 30, 2003

(65) Prior Publication Data

US 2005/0071795 A1    Mar. 31, 2005

(51) Int. Cl.
*G06F 17/50*  (2006.01)
(52) U.S. Cl. ............................................ 716/8; 716/11
(58) Field of Classification Search ................ 716/8–14
See application file for complete search history.

(56) References Cited

U.S. PATENT DOCUMENTS

| | | | | |
|---|---|---|---|---|
| 5,838,583 | A * | 11/1998 | Varadarajan et al. ........... 716/9 |
| 6,237,129 | B1 * | 5/2001 | Patterson et al. .............. 716/8 |
| 6,757,878 | B2 * | 6/2004 | Srinivasan et al. ........... 716/10 |
| 6,792,585 | B1 * | 9/2004 | Ku et al. ....................... 716/10 |
| 2003/0126571 | A1 * | 7/2003 | Srinivasan et al. ........... 716/10 |

* cited by examiner

*Primary Examiner*—Jack Chiang
*Assistant Examiner*—Binh Tat
(74) *Attorney, Agent, or Firm*—Cindy T. Faatz

(57) ABSTRACT

A vector editor for providing an integrated circuit datapath layout. For one aspect, vectors may be extracted from an integrated circuit design input file using a name-based vector extraction approach, a bus/connectivity-based vector extraction approach or another approach. Each vector may be represented as one of a row and a column, wherein the representation differs from that of the associated physical layout. Each bit slice associated with the integrated circuit layout is represented in an orthogonal manner to the vectors. For one aspect, instances of similar master cells may be represented using similar visual representations.

19 Claims, 5 Drawing Sheets

METHOD AND APPARATUS FOR INTEGRATED CIRCUIT DATAPATH LAYOUT USING A VECTOR EDITOR

BACKGROUND

An embodiment of the present invention relates to the field of integrated circuit design, and, more particularly, to an approach for datapath layout.

Due to aggressive density and performance goals of many integrated circuit datapath designs, conventional computer aided design (CAD) automation tools that are not designed with datapath layout requirements in mind may produce unacceptable datapath layout results. High-performance datapath layout is, therefore, often performed manually. Using this approach, layout design of datapaths may consume a large portion of layout resources for some current integrated circuit design projects. For a typical high-performance microprocessor, for example, required layout resources may be on the order of hundreds of layout designer years with the result that datapath circuit and layout design is often the critical path of a corresponding project timeline.

The layout effort needed for a particular project is roughly proportional to the number of drawn devices in the integrated circuit design. As integrated circuit design size grows exponentially (per Moore's law), the manpower needed for manual datapath design will soon become prohibitively expensive and time-consuming and therefore, impractical.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for performing integrated circuit datapath layout using a vector editor is described. In the following description, particular types of integrated circuits, functional unit blocks, graphical representations, systems etc., are described for purposes of illustration. It will be appreciated, however, that other embodiments are applicable to other types of integrated circuits, functional unit blocks, graphical representations and/or systems, for example.

Figure 1:
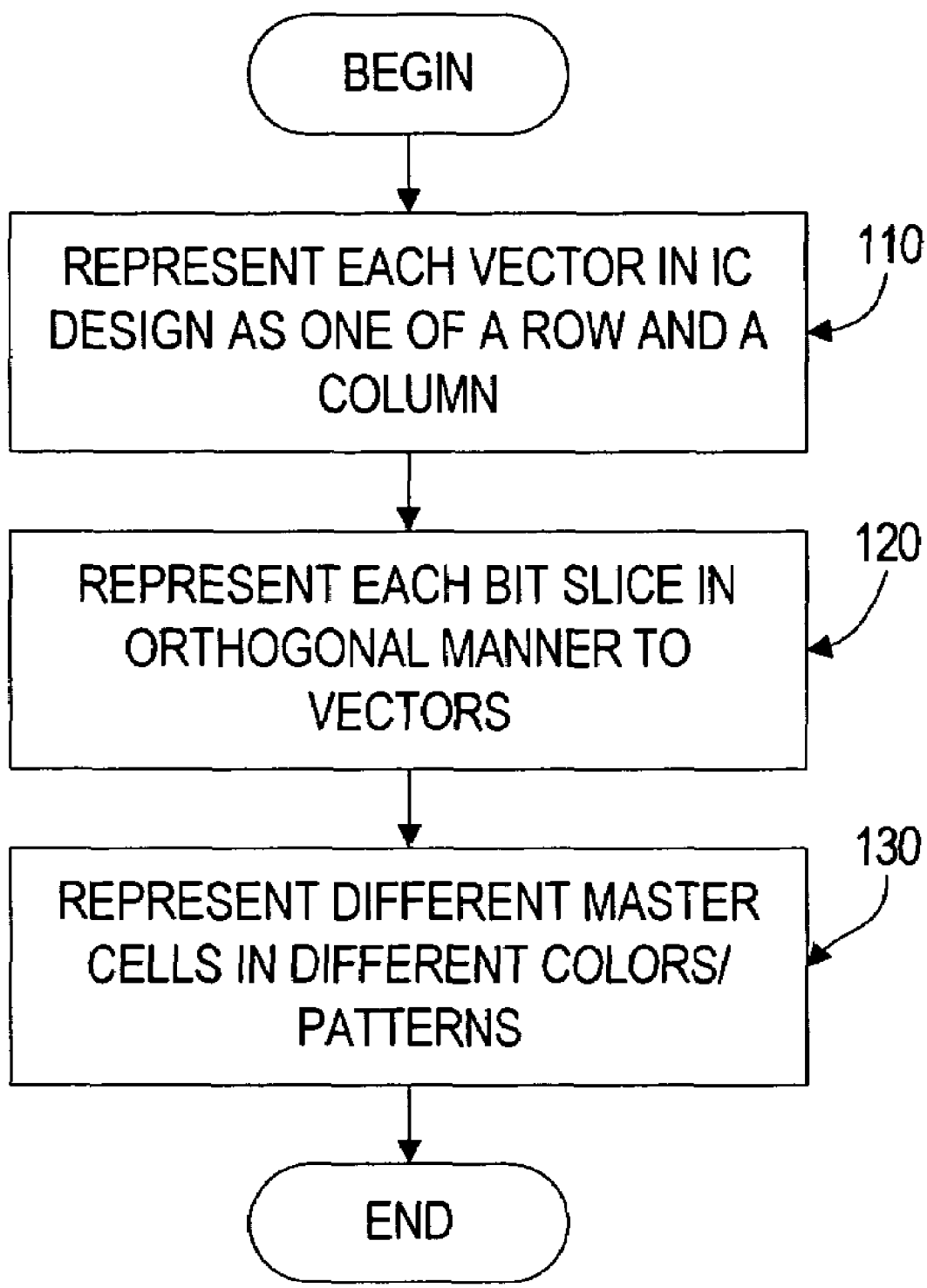
FIG. 1 is a flow diagram showing a method of one embodiment for producing a layout using a vector editor of one embodiment.

For one embodiment, as shown in FIG. 1, each vector associated with an integrated circuit design or portion of an integrated circuit design is represented as one of a row and a column at block 110 and at block 120, each bit slice associated with the integrated circuit layout is represented in an orthogonal manner to the vectors. For example, where each vector is represented as a row, each bit slice is represented as a column and vice versa. This representation provides a logical rather than a physical representation, such that the row and column representation may be different from the corresponding physical layout.

Further, for some embodiments, instances of different master cells may be represented in different visual styles, such as using different colors and/or using different shading and/or fill approaches, for example, at block 130 so that it is straightforward to identify cells with similar and/or different functionality. The vectors and bit slices may be so represented, for example, via a graphical user interface (GUI) that provides for a designer to easily manipulate the layout of the integrated circuit by moving vectors, bit slices and/or associated connections. Further details of these and other embodiments are provided below.

Vector, as the term is used herein, may refer to a set of repeated or bussed instances, e.g. a group of cell instances with same and/or similar functionality that should be placed regularly to achieve a more desirable layout. A vector may also include a set of pins. A vector may typically include one instance per bit slice. Bit slice, as the term is used herein, refers to the circuitry corresponding to one bit in a multi-bit datapath.

Figure 2:
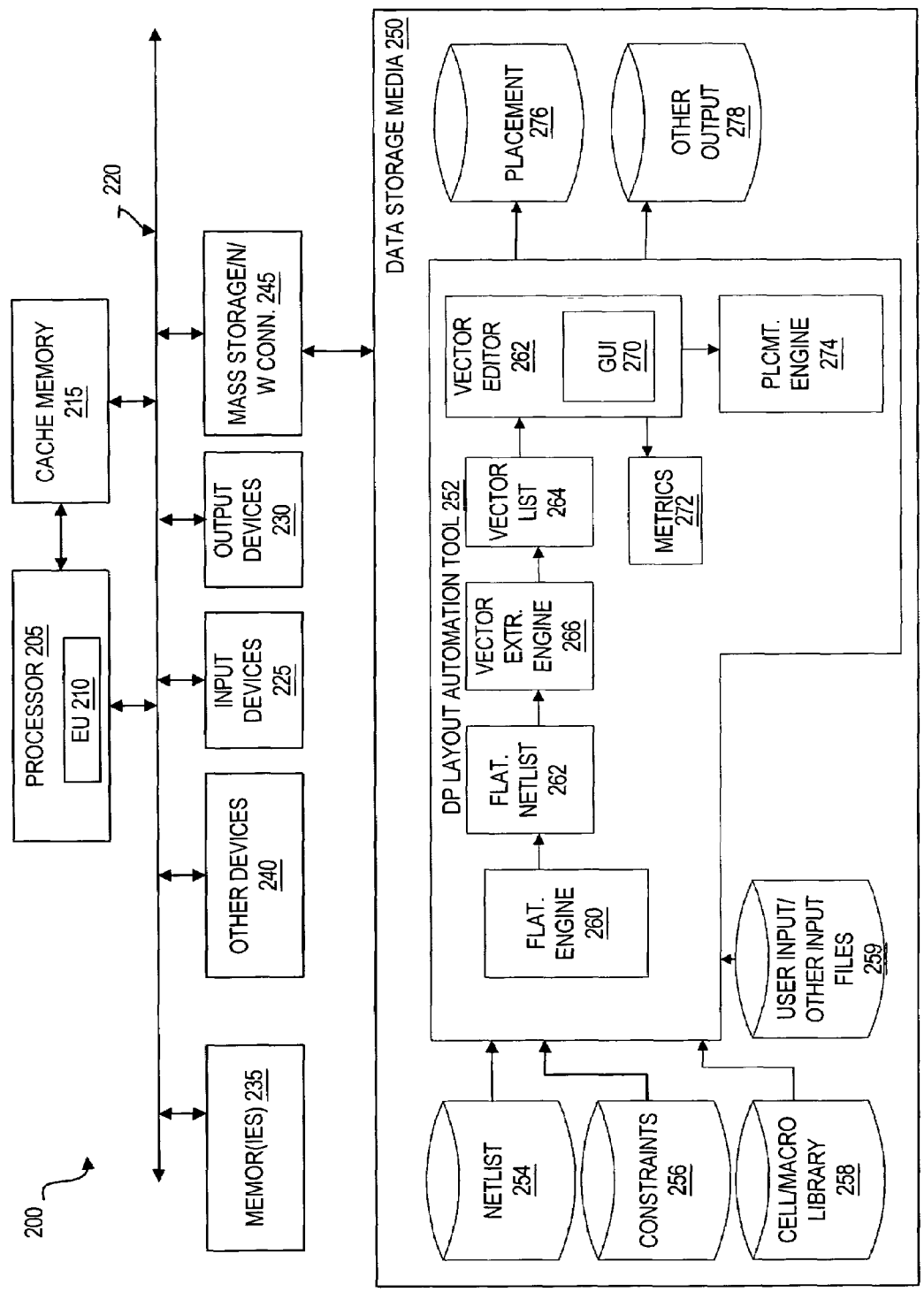
FIG. 2 is a block diagram of a computer system in which a vector editor layout tool of one embodiment may be implemented.

FIG. 2 is a block diagram of a computer system 200 in which the method and/or apparatus for editing a datapath layout using a vector editor of one embodiment may be advantageously implemented. For this embodiment, the computer system 200 may be a workstation computer system such as a Hewlett Packard HP 9000 Enterprise Server manufactured by Hewlett Packard Company of Palo Alto, Calif. Other types of workstations and/or other types of computers, machines and/or computer systems are within the scope of various embodiments.

The computer system 200 includes a processor 205 including an execution unit 210 to execute instructions. A cache memory 215 may be coupled to or integrated with the processor 205 to store recently and/or frequently used instructions. The processor 205 is coupled to a bus 220 to communicate information between the processor 205 and other components in the computer system 200.

Also coupled to the bus 220 are one or more input devices 225, such as a keyboard and/or a cursor control device, one or more output devices 230, such as a monitor and/or printer, one or more memories 235 (e.g. random access memory (RAM), read only memory (ROM), etc.), other peripherals 240 (e.g. memory controller, graphics controller, bus bridge, etc.), and one or more mass storage devices and/or network connectivity devices 245.

The mass storage device(s) and/or network connectivity devices 245 may include a hard disk drive, a compact disc read only memory (CD ROM) drive, an optical disk drive and/or a network connector to couple the computer system 200 to one or more other computer systems or mass storage devices over a network, for example. Further, the mass storage device(s) 245 may include additional or alternate mass storage device(s) that may be accessible by the computer system 200 over a network (not shown).

A corresponding data storage medium (or media) 250 (also referred to as a computer-accessible storage medium) may be used to store instructions, data and/or one or more programs to be executed by the processor 205. For one embodiment, the data storage medium (or media) 250 stores information, instructions and/or programs 252-278 that are used to perform layout planning and/or synthesis including editing a datapath layout. For this exemplary embodiment, a datapath layout automation tool 252 receives as inputs a netlist 254, physical, electrical and/or timing constraints 256, and a cell/macro library 258 associated with an integrated circuit for which it is desired to provide a datapath layout. Other types of input data 259, such as user-specified constraints, etc. may also be received by the datapath layout automation tool 252.

Figure 3:
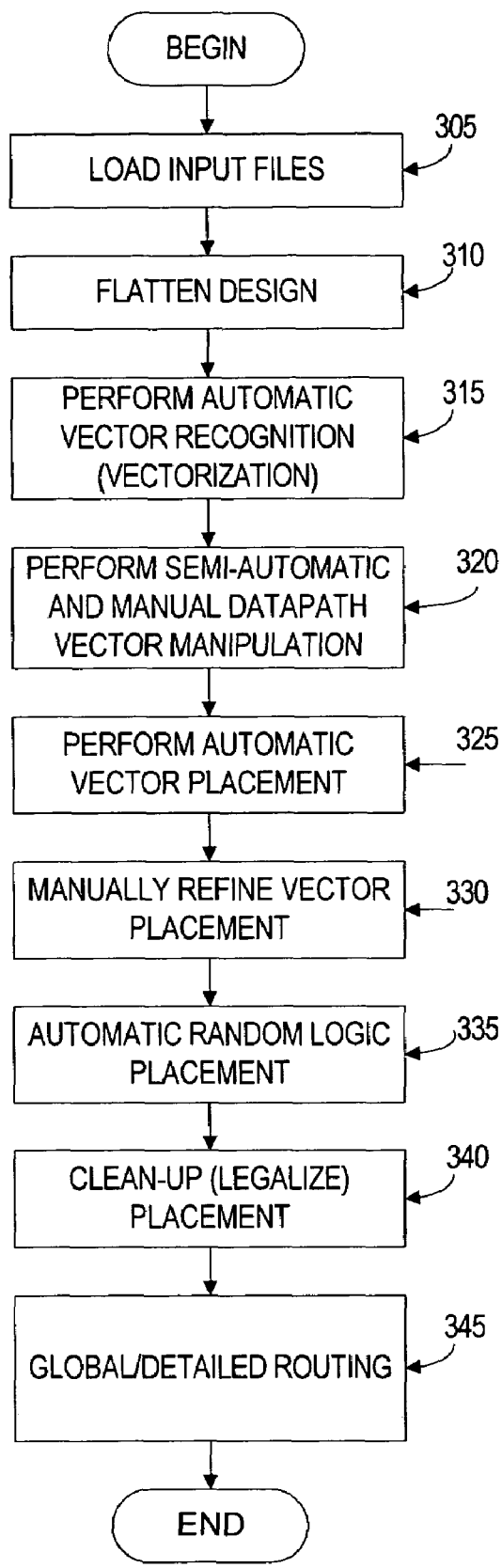
FIG. 3 is a flow diagram showing a method of one embodiment for producing an integrated circuit layout using a vector editor of one embodiment.

Referring to FIGS. 2 and 3, responsive to the information received at block 305 (FIG. 3), if the input netlist 254 is hierarchical, a flattening engine 260 in the datapath layout automation tool 252 may expand/flatten the netlist 254 down to a user-specified leaf level 262 at block 310. For one embodiment, many of the operations described below in reference to producing the datapath layout are performed on the expanded netlist 262 in order to reduce wasted area due to hierarchy rules and facilitate global optimization.

At 315, after flattening the netlist, the datapath layout automation tool 252 may perform a vectorization/regularity extraction process to produce a vector and connectivity matrix 264. This process may be performed, for example, by a vector extraction engine 266. Datapath circuits generally have some regularity in the sense that they can be partitioned into bit slices, each of which has the same or similar functionality as described above. Goals of the vectorization process may include analysis of regularity for the datapath place and route process, automatic vector creation from instances, categorization, grouping of a minimum/maximum number of instances, making vector flylines and pin alignment as straight as possible and/or achieving large-sized vectors.

Figure 4:
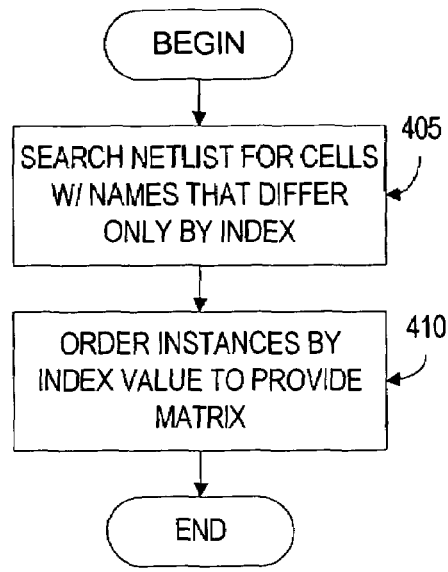
FIG. 4 is a flow diagram showing a method for vector extraction in accordance with one embodiment.

According to one embodiment, the datapath layout automation tool 252 uses a name-based vector extraction approach that takes advantage of the regular naming schemes used by circuit designers as shown in FIG. 4. The datapath layout automation tool 252 may, for example, search the flattened netlist files 262 for cells that have names that differ from each other by one or more index values to identify groups of instances with the same/similar functionality and/or purpose at block 405. The index values may then be used by the tool 252 to order the instances and position the cell into the vector at block 410.

Exemplary pseudo-code for a name-based vector extraction approach in accordance with one embodiment is provided below:

```
Let L = the list of all cell instances in the design
Foreach Ci ∈ L, Parse name of C into base name + indexes
Sort L by base name then index
While (L not empty)
    Let S = Ø
    Remove Ci from the front of L
    Add Ci to S
    Assign column of Ci based on index
    While ((L not empty) and (Cj = front L) and (Cj matches base name Ci))
        Remove Cj from the front of L
        Add Cj to S
        Assign column of Cj based on index
    Endwhile
    If (|S| > Cmin)
        Create a vector from S
    Endif
Endwhile
```

While one name-based vector extraction approach is described above for purposes of example, it will be appreciated that for different naming approaches, the name-based vector extraction approach of various embodiments may be different. For example, instead of searching for names that differ only by an index value, a different approach may be used to identify similar cells.

Figure 5:
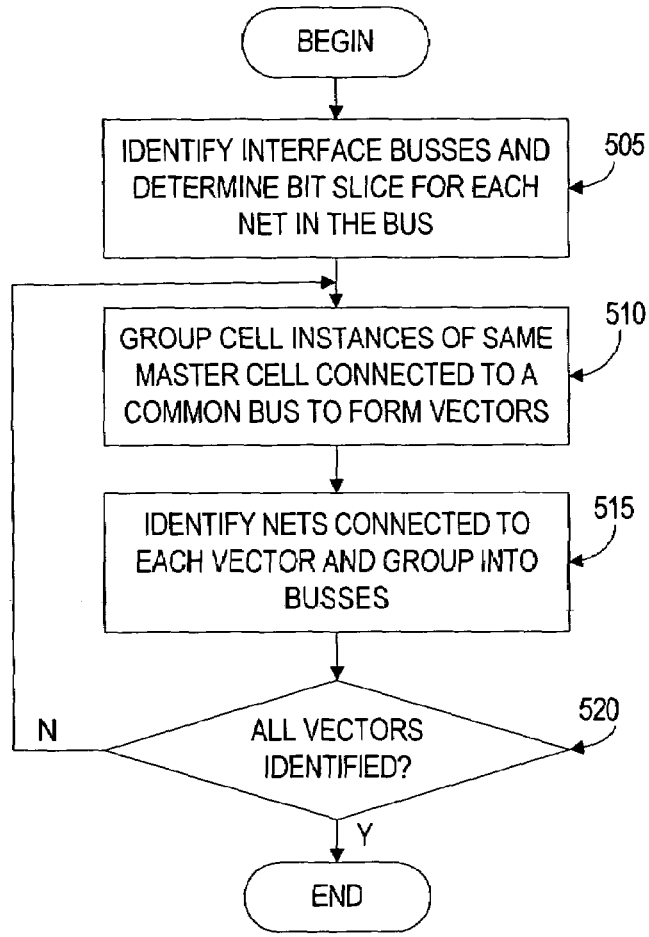
FIG. 5 is a flow diagram showing a method for vector extraction in accordance with another embodiment that may be used separately or in conjunction with the method of FIG. 4.

Alternatively, or in addition to the name-based vector extraction approach, the datapath layout automation tool 252 may use a bus/connectivity-based vector extraction approach that uses connectivity information to determine which instances belong in each vector as shown in FIG. 5. The bus/connectivity-based vector extraction approach of one embodiment may begin by identifying interface busses and determining the bit slice for each net in the bus at block 505. This may be accomplished by mapping the actual physical pin locations onto the datapath matrix, or by specifying the mapping manually. Once the interface busses are identified, they may be used to identify vectors. All cell instances of the same and/or similar master cell connected to a common bus may be grouped together to form vectors at block 510. Once those vectors are created, the nets connected to each vector may be identified and grouped into busses at block 515. The process repeats at block 510 until it is determined at block 520 that all such vectors for a desired portion of the datapath layout of interest have been identified.

Exemplary pseudo-code for a bus/connectivity-based vector extraction approach for one embodiment is provided below:

```
Let NS = the set of all nets in the design
Let CS = the set of all cell instances in the design
Assume BQ and VQ are queues
BQ = NameBasedVectorize(N ∈ NS : N is an interface net)
VQ = Ø
While ((BQ not empty) ∨(VQ not empty))
    While (BQ not empty)
        Remove bus B from front of BQ
        Let S_i = {I | I ∈ CS, I connects to net N, N ∈ B, I not vectorized}
        Let S_v = NameBasedVectorize(S_i)
        Foreach V_i ∈ S_v
            Align V_i to B
            Add V_i to VQ
        Endfor
    Endwhile
    While (VQ not empty)
        Remove vector V from front of VQ
        Let S_n = {N | N ∈ NS, N connects to inst I, I ∈ V}
        Let S_b = NameBasedVectorize(S_n)
        Foreach B_i ∈ S_b
            Align B_i to V
            Add B_i to BQ
        Endfor
    Endwhile
Endwhile
```

Other approaches to bus/connectivity-based vector extraction are within the scope of various embodiments.

Referring back to FIGS. 2 and 3, for one embodiment, if additional constraints 256 have been specified by the user, the vector extraction process at block 315 may also take these into account in extracting the vector/connectivity matrix 264. Examples of such constraints may include grouping and/or ordering constraints, starting indentation (e.g. in terms of number of bits) for a vector, offsets, ordering between bits, etc. The hierarchical nature of groups may also be specified as described in co-pending patent application Ser. No. 10/039,637 entitled, "A Method and Apparatus for Layout Synthesis of Regular Structures Using Relative Placement," Attorney Docket Number 42390.P12454 to Nagbhushan et al., filed Dec. 31, 2001 and assigned to the assignee of the present invention. Other types of constraints may also be specified for some embodiments.

At block 320, the placement process for the datapath logic begins. For one embodiment, the datapath placement process includes an initial manual editing process at block 320, followed by a semi-automatic and manual datapath vector manipulation process at block 325 and a subsequent manual refinement process at block 330. To facilitate the manual editing and refinement processes, the datapath layout automation tool 252 of one embodiment further includes a vector editor 268 to provide an interactive interface for visualizing and editing the extracted vectors and associated connections.

The vector editor of one embodiment is capable of operating on variety of functional unit block (FUB) alignment styles, where the actual, physical layout may look quite complicated. In other words, a logical layout representation in accordance with one or more embodiments may be provided for a variety of physical forms, a logical layout representation in accordance with various embodiments may be provided. For some embodiments, a user can select from a variety of compilation options to determine the particular FUB alignment style.

For example, the vector editor 268 of one embodiment may be used to operate on control-aligned functional unit blocks (where well-alignment is in the control direction) and/or data-aligned functional unit blocks (where well-alignment is in the direction of the major data buses). Furthermore, the vector editor 268 may be used on rotated functional unit blocks (FUBs) in either of the above styles. Other types of alignment styles may be within the scope of various embodiments. The interactive interface may be in the form of a graphical user interface (GUI) 270, the features of which are described in more detail below.

Figure 6:
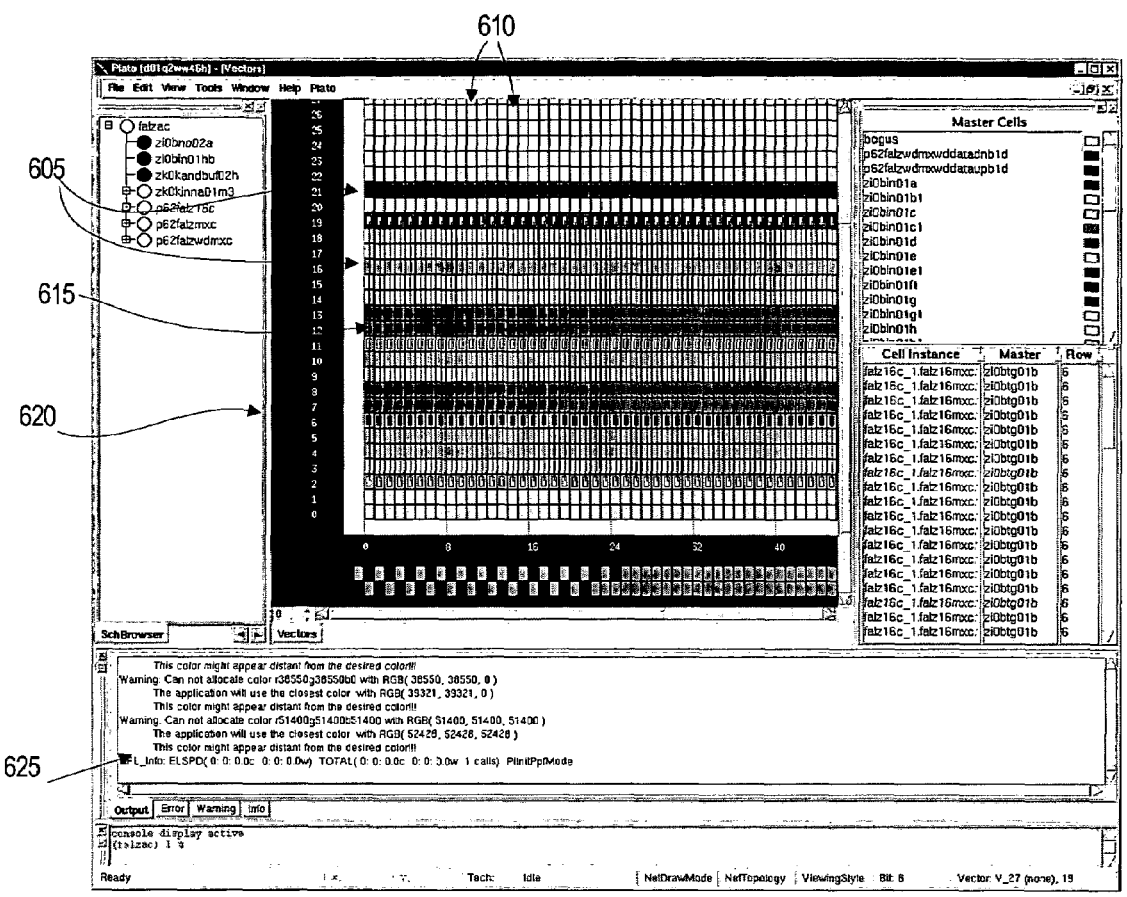
FIG. 6 is a representation of an exemplary vector editor user interface of one embodiment.

FIG. 6 is a screen shot showing an exemplary datapath layout representation that may be provided by the vector editor GUI 270 of one embodiment. As shown in FIG. 6, vectors may be arranged in rows, such as example rows 605, and bit slices may be arranged in columns, such as example columns 610, where the row and column representation may not, and typically does not, match the actual physical layout. Connectivity information may be indicated by lines such as the example lines 615 that interconnect various cells as shown.

The vector editor 268 of one embodiment, via the GUI 270, may also provide for instances of similar master cells to be displayed using similar visual representations. For example, different colors, shades fill and/or stippling techniques may be used, such that cell instances with the same or similar functionality may be represented similarly for easier identification.

For one embodiment, for example, a range of different colors may be used. While the screen shot of FIG. 6 is provided in gray scale, it will be appreciated that the various tones of gray may instead be replaced by various colors such that master cells with similar functionality may be more easily identified.

More specifically, during vector extraction or another part of the datapath layout process, the vector extraction engine 266 (FIG. 2) or other component of the layout automation tool 252 and/or vector editor 262 may assign a color to each cell and assign the same or a similar color to other same and/or similar cells. The determination of which cells are to be considered similar enough to be identified with the same and/or similar color may be made by the vector extraction engine, for example, based on a predetermined algorithm and/or in response to user input.

The manner in which cells are grouped under the same or similar visual representation may depend on several factors including the number of available visual representations that can be discerned by a user and/or are provided by the tool 252 (e.g. the number of available colors), the number of different types of cells, etc. Further, cells may be considered to be the same and/or similar based on, for example, threshold voltage, the number of inputs, size/power level, and/or functionality, etc.

In operation, the vector editor may receive a list of cells and a list of colors (and/or other visual representation characteristics) and, in response, create a look-up table by assigning an available visual representation to each cell in the list of cells. For some embodiments, if there are more cell types than available visual representations, the visual representations may be re-used. Alternatively, user intervention may be requested to select one or more cell groupings to correspond to a particular visual representation. Further, for some embodiments, a user may have the option to assign visual representations to particular cell types or cell family types, for example, either during the initial visual representation assignment process or at another point in the datapath layout process. It will be appreciated that other approaches to assigning visual representation characteristics to cells are within the scope of various embodiments.

In the manner described above, the vector editor of one or more embodiments may provide an abstraction level between layout and circuit editors. The vector editor 268 provides a simplified logical view (rather than a physical view) to better facilitate connectivity visualization and vector manipulation as compared to the layout canvasses provided by conventional layout tools, where the vector and bit structure may not be readily apparent.

The vector editor 268 may also enable connectivity information to be displayed that indicates connectivity from selected vectors to other vectors and/or to interface pins. Connectivity may be displayed for all selected instances, for example. The data and control connectivity may be extracted and displayed in different colors or using different line weights or patterns, for example. Connectivity between the vectors and interface busses may also be displayed. Such visualization capabilities enable easier identification of misalignment and cross-connectivity between vectors.

The vector editor 262 may provide for a set of manual editing capabilities to operate on the vectors described above. For one embodiment, such capabilities may include, for example, drag and drop editing to group instances into vectors and to position vectors in the proper bit slices, creating, deleting, moving, swapping, spreading and reversing vectors.

The vector editor 262 may also provide for the capability to align vectors based on connectivity with other vectors and/or interface pins. For example, a significant factor in the efficient layout of datapath functional unit blocks (FUBs) may be the high cost of jogging large data busses that carry signals into and out of the FUBs. Using the vector editor 262, for one embodiment, a designer may choose to align vectors with respect to another vector or with respect to the interface pins of the FUB. In this manner, user productivity and resulting designs may be improved.

For some embodiments, the vector editor 262 may also provide high-level commands that enable automatic correction of some of the issues that may be identified by the metrics mentioned above. Some examples may include auto-merging of split vectors based on recursive bus and vector merging, auto-alignment based on bus-tracing.

Pseudo-code for implementing exemplary auto-merging and auto alignment operations is provided below for purposes of example:

```
Algorithm: Align Vectors
Let S = the set of all vectors in the design
Let S_A = the set of seed vectors selected by the user
Let S_U = S − S_A (S_A ∪ S_U = S, S_A ∩ S_U = Ø)
Foreach V_i ∈ S_A
    Foreach V_j ∈ S_U
        Foreach C_j ∈ V_j, Mark Instance C_j Unaligned
        Foreach C_i ∈ V_i, C_j ∈ V_j
            If (C_i connects to C_j via net N_ij and N_ij is a data net)
                Let Column(C_j) = Column(C_i)
                Mark Instance C_j Aligned
            Endif
        Endfor
        If (∃ C_j ∈ V_j : C_j is Unaligned)
            Foreach C_j ∈ V_j,
                Reset Column(C_j) to its previous value
            Endfor
        Else
            Let S_A = S_A ∪ V_j
            Let S_U = S_U − V_j
        Endif
    Endfor
Endfor
Algorithm: Merge Vectors
Let BS = the set of all busses in the design
Let NS = the set of all nets in the design
Let VS = the set of all vectors in the design
Let CS = the set of all cell instances in the design
Assume BQ and VQ are queues
BQ = {B ∈ BS: |B| ≥ Cmin}
VQ = Ø
While ((BQ not empty) ∨ (VQ not empty))
    While (BQ not empty)
        Remove bus B from front of BQ
        Let S_i = {I | I ∈ CS, I connects to net N, N ∈ B}
        Let S_v = {V | V ∈ VS, (I ∈ V) ⇒ (I ∈ S_i)}
        Foreach V_i ∈ S_v, V_j ∈ S_v, V_i ≠ V_j
            If (MergeTest (V_i, V_j))
                Merge V_j into Vi
                Add V_i to VQ if |V_i| > Cmin
            Endif
        Endfor
    Endwhile
    While (VQ not empty)
        Remove vector V from front of VQ
        Let S_n = {N | N ∈ NS, N connects to inst I, I ∈ V}
        Let S_b = {B | B ∈ BS, (N ∈ B) ⇒ (N ∈ S_n)}
        Foreach B_i ∈ S_b, B_j ∈ S_b, B_i ≠ B_j
            If (MergeTest (B_i, B_j))
                Merge B_j into B_i
                Add B_i to BQ if |B_i| > Cmin
            Endif
        Endfor
    Endwhile
Endwhile
```

The merge test in the previous algorithm determines whether a pair of vectors or busses should be merged. The merge test is based on user controlled heuristics. Generally, two vectors will be merged if they do not have any column overlap. Tests may also be done to see that they have the same base name and the same functionality. Direct user control of the merge process is also supported.

Other types of automatic correction or other high-level commands are within the scope of various embodiments.

Some exemplary commands for one embodiment, including those described above, are provided below. It will be appreciated that, for other embodiments, a different set of commands may be used.

| Command | Function |
|---|---|
| Align Vector(s) by Pins | Identifies the bus with the best connectivity to the vector, and realigns the selected vector to it |
| Align Vector | Reorders the instances in selected rows based on connectivity to another vector |
| Delete All | Deletes all vectors in the design |
| Delete Vector(s) | Deletes one or more vectors from the matrix |
| Delete Group | Deletes selected group vectors |
| Insert Vector(s) | Inserts vectors where indicated |
| Merge Vectors | Combines two vectors to improve the design |
| Reverse Vector(s) | Reverse the order of all instances in selected vectors |
| Reverse Matrix | Reverse the order of all instances in all vectors |
| Spread Vectors | Increase the separation of bits between instances if they are too close together |
| Swap Vectors | Swap the positions of two vectors in the matrix; increases visibility in the matrix |
| Split Vector | Break a vector into two smaller ones to improve the design |
| Move | Moves vectors to appropriate rows |
| Fix/Unfix Vector | Straighten connectivity to pins or other vectors |
| Show Flylines | Turn on/off connectivity lines between connected instances in the vector view |

The above vector editing commands (or other commands for other embodiments) may be used to perform necessary vector editing operations for one embodiment in the following manner, where the Vector List Window 620, and output window 625 are as shown in FIG. 6:

| | Action | Result |
|---|---|---|
| 1. | Place the cursor anywhere within the Vector List window, then right click and hold | This brings up the Vector Editing sub-menu containing vector editing commands and options |
| 2. | With the right button still held down, drag the cursor over the dashed line at the top of the sub-menu, then release | The Vector Editing sub-menu opens in its own window and stays open until closed |
| 3. | To use any command, first select your vectors, then invoke the command | Actions and/or any instructions are shown in the output window |
| 4. | Perform vector editing operations until you are satisfied with the quality of your manual editing, then left-click on the top right corner of the sub-menu | The Vector Editing sub-menu closes. |

Thus, vectorization performs a preliminary vector alignment which may then be improved by performing the following tasks as needed:

| Task | Sub-tasks or Descriptions |
|---|---|
| Position the Datapath Matrix | Align the matrix to pins |
| Align Vectors | Flylines to pins<br>Flylines to other vectors |
| Merge Vectors | Data connectivity<br>Control connectivity |
| Fix/UnFix Vectors | Straighten connectivity to pins<br>Straighten connectivity to other vectors |
| Delete Bad Vectors | Bad flylines that can't be straightened<br>No connectivity to other vectors<br>Containing known control instances |

Once a designer is satisfied with the quality of the manual editing, the vectors may be saved and finalized and provided as an input to a placement engine 274 to produce the associated placement Once the various datapath placement processes have been completed, random logic instances (also referred to herein as RLS) may then be placed at blocks 335 and 340. As for the datapath logic placement, the RLS placement may be performed using a combination of automatic and manual processes.

With continuing reference to FIG. 2, for some embodiments, the vector editor 268 may also be capable of generating an assessment of the quality of vectors 272 using several metrics such as the degree of cross-connectivity, the amount of misalignment and the column utilization, for example. In this manner, potential problems in placement and routing may be detected, such as cross-connections due to flipped vectors or pins, over-utilization in particular columns, etc. Placement may then be adjusted based on the metrics 272. Other types of metrics may be provided for other embodiments.

Based on the metrics and/or other cost computations, the placement process may be repeated to re-edit placements as needed.

A completed placement 276 may then be provided as output and used as a basis for subsequent actions such as routing at block 345. Other output 278 may also or alternatively be provided.

Using the approaches of various embodiments described above, it may be possible to produce an integrated circuit datapath layout in less time than when using conventional tools.

Thus, various embodiments of a method and apparatus for performing integrated circuit datapath layout are described. In the foregoing specification, the invention has been described with reference to specific exemplary embodiments thereof. It will, however, be appreciated that various modifications and changes may be made thereto without departing from the broader spirit and scope of the invention as set forth in the appended claims. For example, it will be appreciated that various actions in the methods described above may be performed in a different order and/or some actions may be performed concurrently according to various embodiments. The specification and drawings are, accordingly, to be regarded in an illustrative rather than a restrictive sense.

What is claimed is:

1. A method comprising:
representing each vector associated with an integrated circuit datapath design as one of a row and a column in a graphical interface;
representing each bit slice associated with the integrated circuit datapath design in an orthogonal manner to the vectors in the graphical interface, the corresponding vector and bit slice representation in the graphical interface being different than an associated physical layout; representing information indicating connectivity between a selected vector and at least one of another vector and interface pins; providing drag and drop editing capabilities to move a vector, wherein, each vector includes a plurality of cell instances, and wherein, providing drag and drop editing capabilities includes providing drag and drop editing capabilities to move a group of cell instances; and providing an output capable of being used by a placement engine to produce an associated placement.

2. The method of claim 1 further comprising:
using similar visual representations to indicate cell similarities.

3. The method of claim 1 wherein
representing each vector includes representing each vector as a row, and wherein
representing each bit slice includes representing each bit slice as a column.

4. An apparatus comprising:
a vector extraction engine to extract vectors from an input file associated with an integrated circuit datapath design; and
a vector editor to provide a graphical interface to represent and edit the extracted vectors as one of a row and a column and to represent bit slices in an orthogonal manner to the extracted vectors, the vector editor further to visually represent connectivity information indicating connections between a vector and one of another vector and an interface pin, the graphic interface further to provide drag and drop editing capabilities to move one or more of vectors, bit slices and connections, the vector editor to provide an output that is capable of being used by a placement engine to produce an associated placement.

5. The apparatus of claim 4 wherein
the graphical interface is further to represent similar cells associated with the integrated circuit design using a similar visual representation.

6. The apparatus of claim 5 wherein
the vector extraction engine is to extract vectors using a name-based vector extraction approach.

7. The apparatus of claim 5 wherein
the vector extraction engine is to extract vectors using a bus/connectivity-based vector extraction approach.

8. The apparatus of claim 4 wherein
the graphical interface is further to represent similar cells associated with the integrated circuit design using a similar color and stippling.

9. The apparatus of claim 4 wherein
the vector editor is further to assign one of a plurality of predetermined visual representations to each cell type associated with the integrated circuit design.

10. The apparatus of claim 9 wherein
the vector editor is to provide data to a placement engine, the placement engine to output a datapath placement associated with the integrated circuit design.

11. The apparatus of claim 10 wherein
the vector editor is further to provide at least one metric indicating a quality of the data provided by the vector editor.

12. The apparatus of claim 4 wherein
the vector editor provides at least one of an auto-merge and an auto-align command.

13. A computer-accessible storage medium storing information that, when accessed by a machine, causes the machine to:
represent vectors associated with an integrated circuit datapath design in one of a row and a column in a graphical interface;
represent bit slices associated with the integrated circuit datapath design in an orthogonal manner in the graphical interface, wherein the manner in which the vectors and bit slices is represented in the graphical interface is different than an associated physical layout; represent connectivity between a vector and one of another vector and an interface pin; provide drag and drop editing capabilities to move a vector; and provide an output that is capable of being used by a placement engine to produce an associated placement.

14. The computer-accessible storage medium of claim 13 further storing information that, when accessed by a machine, causes the machine to:

extract the vectors from an input file associated with the integrated circuit datapath design.

15. The computer-accessible storage medium of claim 14 wherein extracting the vectors from the input file includes using a name-based extraction approach.

16. The computer-accessible storage medium of claim 14 wherein extracting the vectors from the input file includes using a bus/connectivity-based extraction approach.

17. An apparatus comprising:

a vector editor to represent vectors associated with an integrated circuit datapath design as one of rows and columns and bit slices associated with the integrated circuit datapath design in an orthogonal manner in a graphical interface, wherein the row and column representation is different than an associated physical layout, the vector editor to provide one of an auto-merge and an auto-align command to operate on the vectors, the vector editor to represent connectivity between a vector and one of another vector and an interface pin, the vector editor to provide drag and drop editing capabilities to edit the vectors, bit slices and associated connectivity; and a placement engine to receive an output of the vector editor and to produce an associated placement.

18. The apparatus of claim 17 wherein, the vector editor is further to use similar visual representations to identify similar cell instances.

19. The apparatus of claim 18 wherein, similar visual representations includes a combination of a similar color and a similar stippling technique.

* * * * *